(12) United States Patent
Carroll et al.

(10) Patent No.: US 8,252,204 B2
(45) Date of Patent: *Aug. 28, 2012

(54) GLASS COMPOSITIONS USED IN CONDUCTORS FOR PHOTOVOLTAIC CELLS

(75) Inventors: Alan Frederick Carroll, Raleigh, NC (US); Kenneth Warren Hang, Hillsborough, NC (US); Giovanna Laudisio, Bristol (GB); Brian J. Laughlin, Apex, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 336 days.

This patent is subject to a terminal disclaimer.

(21) Appl. No.: 12/641,484

(22) Filed: Dec. 18, 2009

(65) Prior Publication Data
US 2011/0146776 A1    Jun. 23, 2011

(51) Int. Cl.
*H01B 1/22* (2006.01)
*B05D 5/12* (2006.01)
*H01L 31/0224* (2006.01)

(52) U.S. Cl. .......................... 252/514; 136/256; 427/74

(58) Field of Classification Search .......... 252/512–514; 136/252–256; 427/74
See application file for complete search history.

(56) References Cited

U.S. PATENT DOCUMENTS

| | | | |
|---|---|---|---|
| 6,436,316 B2 | 8/2002 | Matsumoto | |
| 7,435,361 B2 * | 10/2008 | Carroll et al. | 252/514 |
| 7,780,878 B2 * | 8/2010 | Young et al. | 252/514 |
| 7,790,065 B2 * | 9/2010 | Young et al. | 252/514 |
| 7,998,371 B2 * | 8/2011 | Young et al. | 252/514 |
| 2006/0231800 A1 | 10/2006 | Wang et al. | |
| 2006/0231801 A1 | 10/2006 | Carroll et al. | |
| 2006/0231803 A1 | 10/2006 | Wang et al. | |
| 2006/0231804 A1 | 10/2006 | Wang et al. | |
| 2006/0272700 A1 | 12/2006 | Young et al. | |

FOREIGN PATENT DOCUMENTS
EP    1713092 A2    10/2006

OTHER PUBLICATIONS

International Search Report Dated Aug. 22, 2011 for International Application No. PCT/US2010/061190.

* cited by examiner

*Primary Examiner* — Mark Kopec

(57) ABSTRACT

The invention relates to glass compositions useful in conductive pastes for silicon semiconductor devices and photovoltaic cells.

14 Claims, 1 Drawing Sheet

GLASS COMPOSITIONS USED IN CONDUCTORS FOR PHOTOVOLTAIC CELLS

FIELD OF THE INVENTION

Embodiments of the invention relate to a silicon semiconductor device, and a conductive thick film composition containing glass frit for use in a solar cell device.

TECHNICAL BACKGROUND OF THE INVENTION

A conventional solar cell structure with a p-type base has a negative electrode that may be on the front-side (also termed sun-side or illuminated side) of the cell and a positive electrode that may be on the opposite side. Radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metalized, i.e., provided with metal contacts that are electrically conductive.

There is a need for compositions, structures (for example, semiconductor, solar cell or photodiode structures), and semiconductor devices (for example, semiconductor, solar cell or photodiode devices) which have improved electrical performance, and methods of making.

SUMMARY OF THE INVENTION

An embodiment of the invention relates to composition including: (a) one or more conductive materials; (b) one or more glass frits, wherein at least one of the glass frits includes, based on the wt % of the glass composition: $SiO_2$; $B_2O_3$; $Bi_2O_3$; $CeO_2$ 0.1-3 wt %; F 1-10 wt %; and Na+Li+K 1-3 wt %; and (c) organic vehicle. The glass frits may also include one or more components selected from the group consisting of: Ca, CaO, Mg, MgO, Sr, SrO, Ba, and BaO. The $CeO_2$ may be 0.75-2.5 wt %. The glass frit may include one or more components selected from the group consisting of: $TiO_2$, $Ta_2O_5$, $Nb_2O_5$, and $ZrO_2$. The conductive material may include Ag. The glass frit may be 4-8 wt % of the total composition. The conductive materials may be 75-85 wt % of the total composition. The Na may be selected from: NaO, NaF, and mixtures thereof; wherein the Li is selected from: $Li_2O$, LiF, and mixtures thereof; and wherein the K is selected from: $K_2O$, KF, and mixtures thereof.

An embodiment of the invention relates to composition including: (a) one or more conductive materials; (b) one or more glass frits, wherein at least one of the glass frits includes, based on the wt % of the glass composition: $SiO_2$ 2.5-8 wt %; $B_2O_3$ 3-10 wt %; $Bi_2O_3$ 25-80 wt %; $CeO_2$ 0.1-3 wt %; F 1-10 wt %; and Na+Li+K 1-3 wt %; and (c) organic vehicle.

A further embodiment relates to a method of manufacturing a semiconductor device including the steps of: (a) providing a semiconductor substrate, one or more insulating films, and the thick film composition described herein; (b) applying the insulating film to the semiconductor substrate; (c) applying the thick film composition to the insulating film on the semiconductor substrate, and (d) firing the semiconductor, insulating film and thick film composition. In an aspect, the insulating film may include one or more components selected from: titanium oxide, silicon nitride, SiNx:H, silicon oxide, and silicon oxide/titanium oxide.

A further embodiment relates to a semiconductor device made by the methods described herein. An aspect relates to a semiconductor device including an electrode, wherein the electrode, prior to firing, includes the composition described herein. An embodiment relates to a solar cell including the semiconductor device.

An embodiment relates to a semiconductor device including a semiconductor substrate, an insulating film, and a front-side electrode, wherein the front-side electrode comprises one or more components selected from the group consisting of zinc-silicate, willemite, and bismuth silicates.

DETAILED DESCRIPTION OF THE INVENTION

Figure 1A:
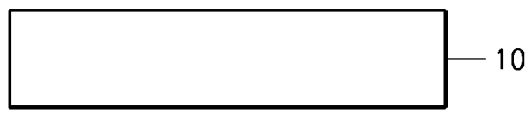
FIG. 1 is a process flow diagram illustrating the fabrication of a semiconductor device.
Reference numerals shown in FIG. 1 are explained below.
10: p-type silicon substrate
20: n-type diffusion layer
30: silicon nitride film, titanium oxide film, or silicon oxide film
40: p+ layer (back surface field, BSF)
60: aluminum paste formed on backside
61: aluminum back electrode (obtained by firing back side aluminum paste)
70: silver or silver/aluminum paste formed on backside
71: silver or silver/aluminum back electrode (obtained by firing back side silver paste)
500: silver paste formed on front side according to the invention
501: silver front electrode according to the invention (formed by firing front side silver paste)
Figure 1B:
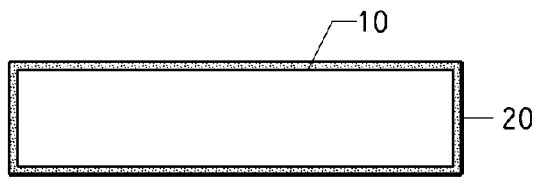
Figure 1C:
Figure 1D:
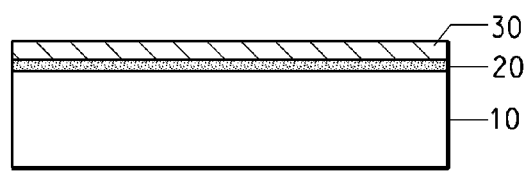
Figure 1E:
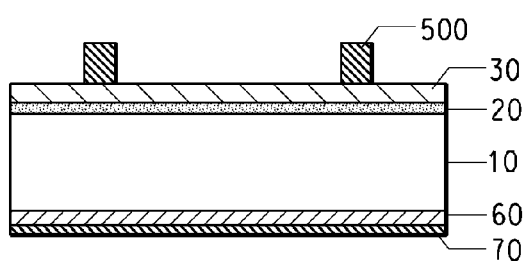
Figure 1F:
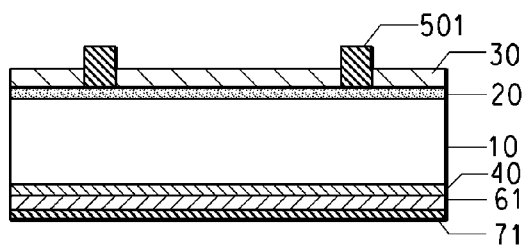

As used herein, "thick film composition" refers to a composition which, upon firing on a substrate, has a thickness of 1 to 100 microns. The thick film compositions contain one or more conductive materials, one or more glass compositions, and organic vehicle. The thick film composition may also include additional components. As used herein, the additional components are termed "additives".

Compositions described herein include one or more electrically functional materials and one or more glass frits dispersed in an organic medium. These compositions may be thick film compositions. The compositions may also include one or more additive(s). Exemplary additives may include metals, metal oxides or any compounds that can generate these metal oxides during firing.

In an embodiment, the electrically functional powders may be conductive powders. In an embodiment, the composition(s), for example conductive compositions, may be used in a semiconductor device. In an aspect of this embodiment, the semiconductor device may be a solar cell or a photodiode. In a further aspect of this embodiment, the semiconductor device may be one of a broad range of semiconductor devices. In an embodiment, the semiconductor device may be a solar cell.

In an embodiment, the thick film compositions described herein may be used in a solar cell. In an aspect of this embodiment, the solar cell efficiency may be greater than 70% of the reference solar cell. In a further embodiment, the solar cell efficiency may be greater than 80% of the reference solar cell. In an embodiment, the solar cell efficiency may be greater than 90% of the reference solar cell.

Glass Frits

An aspect relates to glass compositions (also termed glass frits, or glass frit compositions). Glass compositions may be described in several ways, as recognized by one of skill in the art. Herein, glass compositions are described in two ways: in terms of the weight percent of oxide-containing compounds and fluoride-containing compounds used in the starting material to make the glass (as shown in Table I), and in terms of the calculated elemental weight percent of the raw materials used in the starting material to make the glass (also termed elemental constituency) (as shown in Table II). A certain portion of volatile species may be released during the process of making the glass. An example of a volatile species is oxygen.

If starting with a fired glass, one may calculate the percentages of starting components described herein (elemental constituency) using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; Electron microprobe Energy Dispersive Spectroscopy (EDS); Electron microprobe Wavelength Dispersive Spectroscopy (WDS); Cathodoluminescence (CL).

The glass compositions described herein, including those listed in Tables I and II, are not limiting; it is contemplated that one of ordinary skill in the art of glass chemistry could make minor substitutions of additional ingredients and not substantially change the desired properties of the glass composition. For example, substitutions of glass formers such as $P_2O_5$ 0-3, $GeO_2$ 0-3, $V_2O_5$ 0-3 in weight % may be used either individually or in combination to achieve similar performance. For example, one or more intermediate oxides, such as $TiO_2$, $Ta_2O_5$, $Nb_2O_5$, $ZrO_2$, $CeO_2$, and $SnO2$ may be substituted for other intermediate oxides (i.e., $Al_2O_3$, $CeO_2$, $SnO_2$) present in a glass composition.

An aspect relates to glass frit compositions including one or more fluorine-containing components, including but not limited to: salts of fluorine, fluorides, metal oxyfluoride compounds, and the like. Such fluorine-containing components include, but are not limited to $BiF_3$, $AlF_3$, NaF, LiF, KF, CsF, $ZrF_4$, $TiF_4$ and/or $ZnF_2$.

An exemplary method for producing the glass frits described herein is by conventional glass making techniques. Ingredients are weighed then mixed in the desired proportions and heated in a furnace to form a melt in platinum alloy crucibles. One could employ oxides as raw materials as well as fluoride or oxyfluoride salts. Alternatively, salts, such as nitrate, nitrites, carbonate, or hydrates, which decompose into oxide, fluorides, or oxyfluorides at temperature below the glass melting temperature can be used as raw materials. Heating is conducted to a peak temperature (800-1400° C.) and for a time such that the melt becomes entirely liquid, homogeneous, and free of any residual decomposition products of the raw materials. The molten glass is then quenched between counter rotating stainless steel rollers to form a 10-15 mil thick platelet of glass. The resulting glass platelet was then milled to form a powder with its 50% volume distribution set between to a desired target (e.g. 0.7-1.5 μm). Alternative synthesis techniques may be employed, such as, but not limited to, water quenching, sol-gel, spray pyrolysis, or others appropriate for making powder forms of glass.

The glass compositions used herein, in weight percent total glass composition, are shown in Table I. Unless stated otherwise, as used herein, wt % means wt % of glass composition only. In an embodiment, glass frits compositions described herein may include one or more of $SiO_2$, $B_2O_3$, $P_2O_5$, $Al_2O_3$, $ZrO_2$, $TiO_2$, $Bi_2O_3$, ZnO, CaO, MgO, SrO, BaO, $CeO_2$, $Li_2O$, $Na_2O$, $K_2O$, LiF, NaF, KF, $ZnF_2$ or $BiF_3$. In aspects of this embodiment, the:

$SiO_2$ may be 2.5 to 8 wt %, 4 to 6 wt %, or 4.75 to 5.25 wt %, $B_2O_3$ may be 3 to 10 wt %, 5 to 9 wt %, or 7 to 8 wt %, $P_2O_5$ may be 0 to 5 wt %, 0 to 2 wt %, or 1.5 to 2.5 wt %, $Al_2O_3$ may be 0.1 to 3 wt %, 0.25 to 2 wt %, or 1 to 1.5 wt %, $ZrO_2$ may be 0 to 3 wt %, 0 to 2.5 wt %, or 1 to 2.5 wt %, $TiO_2$ may be 0 to 5 wt %, 0 to 4 wt %, or 2 to 4 wt %, $Bi_2O_3$ may be 25 to 80 wt %, 40 to 70 wt %, or 60 to 64 wt %, ZnO may be 0 to 42 wt %, 5 to 20 wt %, or 15 to 17 wt %, CaO may be 0 to 3 wt %, 0 to 2 wt %, or 1 to 3 wt %, MgO may be 0 to 3 wt %, 0 to 2.75 wt %, or 1 to 2.5 wt %, SrO may be 0 to 4 wt %, 0 to 3.75 wt %, or 3 to 4 wt %, BaO may be 0 to 7 wt %, 1 to 6.5 wt %, or 5 to 6 wt %, $CeO_2$ may be 0.1 to 3 wt %, 0.75 to 3.5 wt %, or 0.75 to 1.25 wt %, $Li_2O$ may be 0 to 4 wt %, 0 to 0.75 wt %, or 1 to 1.25 wt %, $Na_2O$ may be 0 to 4 wt %, 0 to 2 wt %, or 0.4 to 0.5 wt %, $K_2O$ may be 0 to 4 wt %, 0 to 3 wt %, or 2 to 2.25 wt %, LiF may be 0 to 4 wt %, 0 to 2 wt %, or 1 to 1.25 wt %, NaF may be 0 to 4 wt %, 0 to 2 wt %, or 0.4 to 0.5 wt %, KF may be 0 to 4 wt %, 0 to 3 wt %, or 2 to 2.25 wt %, $ZnF_2$ may be 0 to 8 wt %, 0 to 5 wt %, or 3 to 4 wt %, or $BiF_3$ may be 0 to 30 wt %, 0 to 25 wt %, or 10 to 20 wt %.

In an embodiment, some or all of the $Na_2O$ or $Li_2O$ may be replaced with NaF, LiF, $K_2O$, KF, $Cs_2O$, CsF, RbF or $Rb_2O$ to create a glass with properties similar to the compositions listed above where this embodiment the total alkali metal oxide together with the total alkali fluoride content may be 0.1 to 8 wt %, 2 to 5 wt %, or 3.5 to 4 wt %. Further still in this embodiment the total amount of alkaline earth oxides (CaO+ MgO+SrO+BaO) may be 0 to 10 wt %, 1 to 10 wt %, or 1.5 to 6 wt %.

The glass compositions can be described alternatively in wt % of the elements of the glass composition as seen in Table II. In one embodiment the glass may be, in part:

fluorine 1 to 10 elemental wt %, 1 to 5 elemental wt %, or 1.5 to 2 elemental wt %, bismuth 20 to 75 elemental wt %, 50 to 70 elemental wt %, or 50 to 60 elemental wt %, zinc 0 to 35 elemental wt %, 5 to 20 elemental wt %, or 10 to 15 elemental wt %, calcium 0 to 2 elemental wt %, 0.5 to 1.75 elemental wt %, or 1.25 to 1.5 elemental wt %, magnesium 0 to 2 elemental wt %, 0 to 1 elemental wt %, or 0.5 to 1.5 elemental wt %, strontium 0 to 5 elemental wt %, 0 to 4 elemental wt %, or 0.5 to 3.5 elemental wt %, barium 0 to 6 elemental wt %, 0.5 to 5 elemental wt %, or 4 to 5 elemental wt %, lithium 0 to 0.5 elemental wt %, 0.1 to 0.5 elemental wt %, or 0.1 to 0.2 elemental wt %, sodium 0 to 2 elemental wt %, 0.1 to 1 elemental wt %, or 0.1 to 0.2 elemental wt %, or potassium 0 to 3 elemental wt %, 0.1 to 2 elemental wt %, or 1 to 1.5 elemental wt %.

In this embodiment the total amount of alkali elements (including but not limited to Na, Li, and K) may be 0.1 to 5 elemental wt %, 1 to 3 elemental wt %, or 1.25 to 1.75 elemental wt %. Further still in this embodiment the total amount of alkaline earth elements (including but not limited to Ca, Mg, Sr, Ba) may be 0 to 40 elemental wt %, 1 to 20 elemental wt %, or 15 to 18 elemental wt %.

In a further embodiment, the glass frit composition(s) herein may include one or more of a third set of components: $CeO_2$, $SnO_2$, $Ga_2O_3$, $In_2O_3$, NiO, $MoO_3$, $WO_3$, $Y_2O_3$, $La_2O_3$, $Nd_2O_3$, FeO, $HfO_2$, $Cr_2O_3$, CdO, $Nb_2O_5$, $Ag_2O$, $Sb_2O_3$, and metal halides (e.g. NaCl, KBr, NaI).

Table III give the glass properties of the glasses scribed in Tables I and II. In an embodiment, the glasses of Tables I and II have densities which may be from 4 to 6.5 g/cc, 4.25 to 4.5 g/cc, or 5.5 to 6 g/cc. During the firing of a thick film conductor the glass frit will first sinter at an elevated temperature and then still at higher temperature will undergo viscous flow which aids in the sintering of the conductive particles and to form an reactive and adhesive bond to the underlying substrate. Glass sintering onset and softening points can be used to characterize the specific temperatures of the sintering onset and point of maximum viscous flow. The TMA sintering onset is measured as the temperature at the intersection of two tangents: first tangent in the shrinkage-temperature curve prior to start of shrinkage and the second tangent in the region of maximum shrinkage. The softening point is calculated as the temperature of the first minima of the derivative of shrinkage with respect to temperature. The sintering onset and softening point must be correlated to the firing profile used to process the thick film conductor on the substrate. In an embodiment, the glass frit sinter onset may be 300 to 600° C., 400 to 500° C., or 440 to 460° C. In one embodiment, the glass frit softening point may be 300 to 600° C., 400 to 500° C., or 460 to 465° C.

The choice of raw materials could unintentionally include impurities that may be incorporated into the glass during processing. For example, the impurities may be present in the range of hundreds to thousands ppm.

The presence of the impurities would not alter the properties of the glass, the thick film composition, or the fired device. For example, a solar cell containing the thick film composition may have the efficiency described herein, even if the thick film composition includes impurities.

In a further aspect of this embodiment, thick film composition may include electrically functional powders and glass-ceramic frits dispersed in an organic medium. In an embodiment, these thick film conductor composition(s) may be used in a semiconductor device. In an aspect of this embodiment, the semiconductor device may be a solar cell or a photodiode.

The amount of glass frit in the total composition is in the range of 0.1 to 8 wt % of the total composition. In one embodiment, the glass composition is present in the amount of 4 to 8 wt % of the total composition. In a further embodiment, the glass composition is present in the range of 1 to 4 wt % of the total composition.

Conductive Materials

In an embodiment, the thick film composition may include a functional phase that imparts appropriate electrically functional properties to the composition. In an embodiment, the electrically functional powder may be a conductive powder. In an embodiment the electrically functional phase may include conductive materials (also termed conductive particles, herein). The conductive particles may include conductive powders, conductive flakes, or a mixture thereof, for example.

In an embodiment, the conductive particles may include Ag. In a further embodiment, the conductive particles may include silver (Ag) and aluminum (Al). In a further embodiment, the conductive particles may, for example, include one or more of the following: Cu, Au, Ag, Pd, Pt, Al, Ag—Pd, Pt—Au, etc. In an embodiment, the conductive particles may include one or more of the following: (1) Al, Cu, Au, Ag, Pd and Pt; (2) alloy of Al, Cu, Au, Ag, Pd and Pt; and (3) mixtures thereof.

In an embodiment, the functional phase of the composition may be coated or uncoated silver particles which are electrically conductive. In an embodiment in which the silver particles are coated, they are at least partially coated with a surfactant. In an embodiment, the surfactant may include one or more of the following non-limiting surfactants: stearic acid, palmitic acid, a salt of stearate, a salt of palmitate, lauric acid, palmitic acid, oleic acid, stearic acid, capric acid, myristic acid and linoleic acid, and mixtures thereof. The counter ion may be, but is not limited to, hydrogen, ammonium, sodium, potassium and mixtures thereof.

The particle size of the silver is not subject to any particular limitation. In an embodiment, the average particle size may be less than 10 microns, and, in a further embodiment, no more than 5 microns. In an aspect, the average particle size may be 0.1 to 5 microns, for example.

In an embodiment, the silver may be 60 to 90 wt % of the paste composition. In a further embodiment, the silver may be 70 to 85 wt % of the paste composition. In a further embodiment, the silver may be 75 to 85 wt % of the paste composition. In a further embodiment, the silver may be 78 to 82 wt % of the paste composition.

In an embodiment, the silver may be 90 to 99 wt % of the solids in the composition (i.e., excluding the organic vehicle). In a further embodiment, the silver may be 92 to 97 wt % of the solids in the composition. In a further embodiment, the silver may be 93 to 95 wt % of the solids in the composition.

As used herein, "particle size" is intended to mean "average particle size"; "average particle size" means the 50% volume distribution size. Volume distribution size may be determined by a number of methods, including but not limited to LASER diffraction and dispersion method using a Microtrac particle size analyzer.

Additives

In an embodiment, the thick film composition may include an additive. In an embodiment, the additive may be selected from one or more of the following: (a) a metal wherein said metal is selected from Zn, Pb, Bi, Gd, Ce, Zr, Ti, Mn, Sn, Ru, Co, Fe, Cu, and Cr; (b) a metal oxide of one or more of the metals selected from Zn, Pb, Bi, Gd, Ce, Zr, Ti, Mn, Sn, Ru, Co, Fe, Cu and Cr; (c) any compounds that can generate the metal oxides of (b) upon firing; and (d) mixtures thereof.

In an embodiment, the additive may include a Zn-containing additive. The Zn-containing additive may include one or more of the following: (a) Zn metal, (b) metal oxides of Zn, (c) any compounds that can generate metal oxides of Zn upon firing, and (d) mixtures thereof. In an embodiment, the Zn-containing additive may include Zn resinate or organometallic zinc.

In an embodiment, the Zn-containing additive may include ZnO, Zn metal, or a powder containing Zn. The ZnO may have an average particle size in the range of 1 nanometers to 10 microns. In a further embodiment, the ZnO may have an average particle size of 40 nanometers to 5 microns. In a further embodiment, the ZnO may have an average particle size of 60 nanometers to 3 microns. In a further embodiment the ZnO may have an average particle size of less than 100 nm; less than 90 nm; less than 80 nm; 1 nm to less than 100 nm; 1 nm to 95 nm; 1 nm to 90 nm; 1 nm to 80 nm; 7 nm to 30 nm; 1 nm to 7 nm; 35 nm to 90 nm; 35 nm to 80 nm, 65 nm to 90 nm, 60 nm to 80 nm, and ranges in between, for example.

In an embodiment, ZnO may be present in the composition in the range of 0 to 8 wt % total composition. In an embodiment, the ZnO may be present in the range of 1 to 6 wt % total composition. In a further embodiment, the ZnO may be present in the range of 4 to 6 wt % total composition. In a further embodiment, the ZnO may be present in 0.5 to 3 wt % of the total composition.

In one embodiment, the particle size of the metal/metal oxide additive (such as Zn, for example) is in the range of 7 nanometers (nm) to 125 nm; in a further embodiment, the particle size may be less than 100 nm, 90 nm, 85 nm, 80 nm, 75 nm, 70 nm, 65 nm, or 60 nm, for example.

Organic Medium

In an embodiment, the thick film compositions described herein may include organic medium. The inorganic components may be mixed with an organic medium, for example, by mechanical mixing to form pastes. A wide variety of inert viscous materials can be used as organic medium. In an embodiment, the organic medium may be one in which the inorganic components are dispersible with an adequate degree of stability. In an embodiment, the rheological properties of the medium may lend certain application properties to the composition, including: stable dispersion of solids, appropriate viscosity and thixotropy for screen printing, appropriate wettability of the substrate and the paste solids, a good drying rate, and good firing properties. In an embodiment, the organic vehicle used in the thick film composition may be a non-aqueous inert liquid. The use of various organic vehicles, which may or may not contain thickeners, stabilizers and/or other common additives, is contemplated. The organic medium may be a solution of polymer(s) in solvent(s). In an embodiment, the organic medium may also include one or more components, such as surfactants. In an embodiment, the polymer may be ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. In an embodiment, the solvents useful in thick film compositions described herein include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In a further embodiment, the organic medium may include volatile liquids for promoting rapid hardening after application on the substrate.

In an embodiment, the polymer may be present in the organic medium in the range of 5 wt % to 20 wt %, 8 wt % to 18 wt %, or 12 wt. % to 15 wt. % of the total composition, for example. The thick film silver composition may be adjusted to a predetermined, screen-printable viscosity with the organic medium.

In an embodiment, the ratio of organic medium in the thick film composition to the inorganic components in the dispersion may be dependent on the method of applying the paste and the kind of organic medium used. In an embodiment, the dispersion may include 70-95 wt % of inorganic components and 5-30 wt % of organic medium (vehicle) in order to obtain good wetting.

Fired Thick Film Compositions

In an embodiment, the organic medium may be removed during the drying and firing of the semiconductor device. In an aspect, the glass frit, Ag, and additives may be sintered during firing to form an electrode. The fired electrode may include components, compositions, and the like, resulting from the firing and sintering process. For example, in an embodiment, the fired electrode may include zinc-silicates, including but not limited to willemite ($Zn_2SiO_4$) and $Zn_{1.7}SiO_{4-x}$ (in an embodiment, x may be 0-1). In a further embodiment the fired electrode may include bismuth oxide, bismuth fluoride, bismuth silicates, bismuth silicate oxyfluorides, sillenite, or substituted gamma bismuth oxide including but not limited to $Bi_2SiO_5$, $Bi_4(SiO_4)_3$, $BiOF$, $BiF_3$, and $Bi_{12}SiO_{20}$.

In an aspect of this embodiment, the semiconductor device may be a solar cell or a photodiode.

Method of Making a Semiconductor Device

An embodiment relates to methods of making a semiconductor device. In an embodiment, the semiconductor device may be used in a solar cell device. The semiconductor device may include a front-side electrode, wherein, prior to firing, the front-side (illuminated-side) electrode may include composition(s) described herein.

In an embodiment, the method of making a semiconductor device includes the steps of: (a) providing a semiconductor substrate; (b) applying an insulating film to the semiconductor substrate; (c) applying a composition described herein to the insulating film; and (d) firing the device.

Exemplary semiconductor substrates useful in the methods and devices described herein are recognized by one of skill in the art, and include, but are not limited to: single-crystal silicon, multicrystalline silicon, ribbon silicon, and the like. The semiconductor substrate may be junction bearing. The semiconductor substrate may be doped with phosphorus and boron to form a p/n junction. Various methods of doping semiconductor substrates are known.

The semiconductor substrates may vary in size (length× width) and thickness. In a non-limiting example, the thickness of the semiconductor substrate may be 50 to 500 microns; 100 to 300 microns; or 140 to 200 microns. In a non-limiting example, the length and width of the semiconductor substrate may both equally be 100 to 250 mm; 125 to 200 mm; or 125 to 156 mm.

Exemplary insulating films useful in the methods and devices described herein are recognized by one of skill in the art, and include, but are not limited to: silicon nitride, silicon oxide, titanium oxide, $SiN_x$:H, hydrogenated amorphous silicon nitride, and silicon oxide/titanium oxide film. The insulating film may be formed by PECVD, CVD, and/or other techniques known to one of skill in the art. In an embodiment in which the insulating film is silicon nitride, the silicon nitride film may be formed by a plasma enhanced chemical vapor deposition (PECVD), thermal CVD process, or physical vapor deposition (PVD). In an embodiment in which the insulating film is silicon oxide, the silicon oxide film may be formed by thermal oxidation, thermal CVD, plasma CVD, or PVD. The insulating film (or layer) may also be termed the anti-reflective coating (ARC).

Compositions described herein may be applied to the ARC-coated semiconductor substrate by a variety of methods known to one of skill in the art, including, but not limited to, screen-printing, ink-jet, co-extrusion, syringe dispense, direct writing, and aerosol ink jet. The composition may be applied in a pattern. The composition may be applied in a predetermined shape and at a predetermined position. In an embodiment, the composition may be used to form both the conductive fingers and busbars of the front-side electrode. In an embodiment, the width of the lines of the conductive fingers may be 20 to 200 microns; 40 to 150 microns; or 60 to 100 microns. In an embodiment, the thickness of the lines of the conductive fingers may be 5 to 50 microns; 10 to 35 microns; or 15 to 30 microns.

In a further embodiment, the composition may be used to form the conductive, Si contacting fingers.

The composition coated on the ARC-coated semiconductor substrate may be dried as recognized by one of skill in the art, for example, for 0.5 to 10 minutes, and then fired. In an embodiment, volatile solvents and organics may be removed during the drying process. Firing conditions will be recognized by one of skill in the art. In exemplary, non-limiting, firing conditions the silicon wafer substrate is heated to maximum temperature of between 600 and 900° C. for a duration of 1 second to 2 minutes. In an embodiment, the maximum silicon wafer temperature reached during firing ranges from 650 to 800 C for a duration of 1 to 10 seconds. In a further embodiment, the electrode formed from the conductive thick film composition(s) may be fired in an atmosphere composed of a mixed gas of oxygen and nitrogen. This firing process removes the organic medium and sinters the glass frit with the Ag powder in the conductive thick film composition. In a further embodiment, the electrode formed from the conductive thick film composition(s) may be fired above the organic medium removal temperature in an inert atmosphere not containing oxygen. This firing process sinters or melts base metal conductive materials such as copper in the thick film composition.

In an embodiment, during firing, the fired electrode (preferably the fingers) may react with and penetrate the insulating film, forming electrical contact with the silicon substrate.

In a further embodiment, prior to firing, other conductive and device enhancing materials are applied to the opposite type region of the semiconductor device and co-fired or sequentially fired with the compositions described herein. The opposite type region of the device is on the opposite side of the device. The materials serve as electrical contacts, passivating layers, and solderable tabbing areas.

In an embodiment, the opposite type region may be on the non-illuminated (back) side of the device. In an aspect of this embodiment, the back-side conductive material may contain aluminum. Exemplary back-side aluminum-containing compositions and methods of applying are described, for example, in US 2006/0272700, which is hereby incorporated herein by reference.

In a further aspect, the solderable tabbing material may contain aluminum and silver. Exemplary tabbing compositions containing aluminum and silver are described, for example in US 2006/0231803, which is hereby incorporated herein by reference.

In a further embodiment the materials applied to the opposite type region of the device are adjacent to the materials described herein due to the p and n region being formed side by side. Such devices place all metal contact materials on the non illuminated (back) side of the device to maximize incident light on the illuminated (front) side.

The semiconductor device may be manufactured by the following method from a structural element composed of a junction-bearing semiconductor substrate and a silicon nitride insulating film formed on a main surface thereof. The method of manufacture of a semiconductor device includes the steps of applying (such as coating and printing) onto the insulating film, in a predetermined shape and at a predetermined position, the conductive thick film composition having the ability to penetrate the insulating film, then firing so that the conductive thick film composition melts and penetrates the insulating film, effecting electrical contact with the silicon substrate. The electrically conductive thick film composition is a thick-film paste composition, as described herein, which is made of a silver powder, Zn-containing additive, a glass or glass powder mixture having a softening point of 300 to 600° C., dispersed in an organic vehicle and optionally, additional metal/metal oxide additive(s).

An embodiment of the invention relates to a semiconductor device manufactured from the methods described herein. Devices containing the compositions described herein may contain zinc-silicates, as described above.

An embodiment of the invention relates to a semiconductor device manufactured from the method described above.

Additional substrates, devices, methods of manufacture, and the like, which may be utilized with the thick film compositions described herein are described in US patent application publication numbers US 2006/0231801, US 2006/0231804, and US 2006/0231800, which are hereby incorporated herein by reference in their entireties.

EXAMPLES

Glass Property Measurement

The glass frit compositions outlined in Table I and II will be characterized to determine density, softening point, TMA shrinkage, diaphaneity, and crystallinity. Softening points will be determined by the first minima of the TMA derivative shrinkage verses temperature. Crystallinity will be measured by X-ray diffraction. Some of these properties have been measured for some glasses listed in Table I and II, and the properties are shown in Table III.

Paste Preparation

Paste preparations, in general, were prepared using the following procedure: The appropriate amount of solvent, medium and surfactant were weighed and mixed in a mixing can for 15 minutes, then glass frits described herein, and optionally metal additives, were added and mixed for another 15 minutes. Since Ag is the major part of the solids, it was added incrementally to ensure better wetting. When well mixed, the paste was repeatedly passed through a 3-roll mill at progressively increasing pressures from 0 to 300 psi. The gap of the rolls was set to 1 mil. The degree of dispersion was measured by fineness of grind (FOG). A typical FOG value for a paste is less than 20 microns for the fourth longest, continuous scratch and less than 10 microns for the point at which 50% of the paste is scratched.

Processing of Solar Cell Samples

The paste examples of Table IV were made using the procedure described above for making the paste compositions listed in the table. Pastes were applied to 3" full cells, and/or 1" cut cells, and efficiency and fill factor were measured for each sample. For each paste, the mean values of the efficiency and fill factor for 5 samples are shown.

Each 6" wafer sample used for the data in Table IV was made by screen printing using an Ekra printer set with the following printing program: squeegee speed forward 150 mm/sec, squeegee pressure of 3 bar on a 25.4 cm squeegee length, snap off of 1.8 mm. The pattern has 69 fingers of 100 μm width and 2 busbars of 2 mm width on a 280 mesh ultrathin (UT) screen with emulsion of 30 μm thickness. The substrates used were 6 inch multi crystalline cells, acid textured, 70±5Ω/□ emitter, and coated with a PECVD ARC. An Al paste commercially available from DuPont was printed on the non-illuminated (back) side of the device. The device with the printed patterns on both sides was then dried using a profile of 220/230/250/150° C. with a 60 mm/min belt speed. The substrates were then fired with a 4 zone Centrotherm furnace using a 3000 mm/min belt speed, 450-520-570-925° C. temperature profile, sun-side facing up. The actual temperature of the part was measured during processing. The measured peak temperature of each part was 760° C. and each part was above 650° C. for a total time of 4 seconds. The fully processed samples were then tested for PV performance using a calibrated H.A.L.M cetisPV-CT-L1 tester.

Each 3" cut cell sample used for the data in Table IV was made by screen printing using an Ekra printer set with the following printing program: squeegee speed forward 200 mm/sec, squeegee pressure of 3 bar on a 15 cm squeegee length, snap off of 2 mm. The pattern has 30 fingers of 100 μm width and 2 busbars of 2 mm width on a 280 mesh ultrathin (UT) screen with emulsion of 16 μm thickness. The substrates were 3 inch square pieces cut with a dicing saw from multi crystalline cells, acid textured, 65±5Ω/☐ emitter, PECVD ARC. An Al paste commercially available from DuPont was printed on the non-illuminated (back) side of the device. The device with the printed patterns on both sides was then dried using a profile of 220/230/250/150° C. with a 60 mm/min belt speed. The substrates were then fired with a 4 zone Centrotherm furnace using a 3000 mm/min belt speed, 450-520-570-900° C. temperature set points, sun-side facing up. The actual temperature of the part was measured during processing. The measured peak temperature of each part was 760° C. and each part was above 650° C. for a total time of 4 seconds. The fully processed samples were then tested for PV performance using a calibrated H.A.L.M cetisPV-CT-L1 tester.

The pastes described in Table VI were made using the procedures described above. Table VI also shows data for comparative examples using the glasses A and B listed in table V. Pastes were applied to 3" full cells, and/or 1" cut cells, and efficiency and fill factor were measured for each sample. For each paste, the mean values of the efficiency and fill factor for 5 samples are shown. Each sample was made by screen printing using a ETP model L555 printer set with a squeegee speed of 250 mm/sec. The screen used had a pattern of 11 finger lines with a 100 μm opening and 1 bus bar with a 1.5 mm opening on a 10 μm emulsion in a screen with 280 mesh and 23 μm wires. The substrates used were 1.1 inch square sections cut with a dicing saw from multi crystalline cells, acid textured, 60Ω/☐ emitter, and coated with PECVD SiNX:H ARC. A commercially available Al paste, DuPont PV381, was printed on the non-illuminated (back) side of the device. The device with the printed patterns on both sides was then dried for 10 minutes in a drying oven with a 150° C. peak temperature. The substrates were then fired sun-side up with a RTC PV-614 6 zone IR furnace using a 4,572 mm/min belt speed and 550-600-650-700-800-860° C. temperature set points. The actual temperature of the part was measured during processing. The measured peak temperature of each part was 760° C. and each part was above 650° C. for a total time of 4 seconds. The fully processed samples were then tested for PV performance using a calibrated Telecom STV ST-1000 tester.

Test Procedure-Efficiency

The solar cells built according to the method described herein were tested for conversion efficiency. An exemplary method of testing efficiency is provided below.

In an embodiment, the solar cells built according to the method described herein were placed in a commercial I-V tester for measuring efficiencies (Telecom STV ST-1000 or H.A.L.M cetis PV-CT-L1). The Xe Arc lamp in the I-V tester simulated the sunlight with a known AM1.5 intensity of 100 mW/cm^2 and irradiated the front surface of the cell. Parts were maintained at 25° C. during electrical measurements. The tester used a multi-point contact method to measure current (I) and voltage (V) to determine the cell's I-V curve. Both fill factor (FF) and efficiency (Eff) were calculated from the I-V curve.

The above efficiency test is exemplary. Other equipment and procedures for testing efficiencies will be recognized by one of ordinary skill in the art.

TABLE I

Glass Compositions in Weight Percent

| Glass # | SiO2 | Al2O3 | ZrO2 | B2O3 | CaO | ZnO | BaO | MgO | Li2O | SrO | Bi2O3 | P2O5 |
|---|---|---|---|---|---|---|---|---|---|---|---|---|
| 1 | 5.62 | 1.41 | | 8.33 | | | | | | | 79.35 | |
| 2 | 4.76 | 1.19 | | 7.05 | | 15.77 | 0.95 | | | | 65.79 | |
| 3 | 5.03 | 1.26 | | 7.45 | 1.96 | 16.66 | | | | | 62.90 | |
| 4 | 4.87 | 1.22 | | 7.21 | | 16.12 | 5.18 | | | | 60.83 | |
| 5 | 5.27 | 1.32 | | 7.80 | | 18.23 | 4.11 | | | | 56.74 | |
| 6 | 4.87 | 1.22 | | 7.21 | | 12.25 | 5.18 | | | | 60.83 | |
| 7 | 5.06 | 1.26 | | 7.49 | | 16.76 | | 1.42 | | | 63.24 | |
| 8 | 4.95 | 1.24 | | 7.33 | | 16.39 | | | | 3.56 | 61.87 | |
| 9 | 5.43 | 1.36 | | 8.04 | | 13.07 | 5.78 | 2.32 | 0.65 | | 57.74 | |
| 10 | 6.16 | 0.28 | 1.26 | 4.76 | | 15.30 | 4.91 | | | | 43.79 | |
| 11 | 8.17 | 0.38 | 2.23 | 5.13 | | 41.51 | 6.52 | | | | 26.41 | 1.93 |
| 12 | 4.00 | 1.50 | | 8.00 | | 6.00 | | | | | 73.00 | |
| 13 | 2.50 | 0.34 | | 4.68 | | | | | | | 59.50 | |

| Glass # | NaF | TiO2 | ZnF2 | CeO2 | LiF | BiF3 | KF | Total wt % alkaline earth oxide | Total wt % alkali oxide + alkaline fluoride |
|---|---|---|---|---|---|---|---|---|---|
| 1 | 0.48 | | | 1.07 | 1.32 | | 2.42 | 0 | 4.22 |
| 2 | 0.41 | | | 0.91 | 1.12 | | 2.05 | 0.95 | 3.57 |
| 3 | 0.43 | | | 0.96 | 1.18 | | 2.16 | 1.96 | 3.78 |
| 4 | 0.42 | | | 0.93 | 1.14 | | 2.09 | 5.18 | 3.65 |
| 5 | 0.63 | | | 1.01 | 1.73 | | 3.17 | 4.11 | 5.53 |
| 6 | 0.42 | | 3.87 | 0.93 | 1.14 | | 2.09 | 5.18 | 3.65 |
| 7 | 0.43 | | | 0.97 | 1.19 | | 2.18 | 1.42 | 3.80 |
| 8 | 0.42 | | | 0.95 | 1.16 | | 2.13 | 3.56 | 3.71 |
| 9 | 0.46 | | | 1.54 | 1.28 | | 2.33 | 8.09 | 4.73 |
| 10 | 0.39 | 3.28 | | 0.88 | 1.09 | 15.91 | 1.99 | 4.91 | 3.47 |
| 11 | 0.52 | | | 3.12 | 1.44 | | 2.63 | 6.52 | 4.60 |
| 12 | 0.74 | | | 1.00 | 2.04 | | 3.72 | 0 | 6.50 |
| 13 | 2.71 | 2.45 | | 1.03 | 3.18 | 23.60 | | 0 | 5.89 |

TABLE II

Glass Compositions in Elemental Weight Percent

| Glass # | Elemental wt % Si | Elemental wt % Al | Elemental wt % Zr | Elemental wt % B | Elemental wt % Ca | Elemental wt % Zn | Elemental wt % Ba | Elemental wt % Mg | Elemental wt % Ti | Elemental wt % Na | Elemental wt % K |
|---|---|---|---|---|---|---|---|---|---|---|---|
| 1 | 2.63 | 0.74 | | 2.59 | | | | | | 0.20 | 1.35 |
| 2 | 2.23 | 0.63 | | 2.19 | | 12.67 | 0.85 | | | 0.17 | 1.14 |
| 3 | 2.35 | 0.67 | | 2.31 | 1.40 | 13.39 | | | | 0.17 | 1.21 |
| 4 | 2.28 | 0.64 | | 2.24 | | 12.95 | 4.64 | | | 0.17 | 1.17 |
| 5 | 2.46 | 0.70 | | 2.42 | | 14.65 | 3.68 | | | 0.26 | 1.77 |
| 6 | 2.28 | 0.64 | | 2.24 | | 11.81 | 4.64 | | | 0.17 | 1.17 |
| 7 | 2.37 | 0.67 | | 2.33 | | 13.46 | | 0.85 | | 0.18 | 1.22 |
| 8 | 2.31 | 0.65 | | 2.28 | | 13.17 | | | | 0.17 | 1.19 |
| 9 | 2.54 | 0.72 | | 2.50 | | 10.50 | 5.17 | 1.40 | | 0.19 | 1.30 |
| 10 | 2.88 | 0.15 | 0.94 | 1.48 | | 12.29 | 4.40 | | 1.96 | 0.16 | 1.11 |
| 11 | 3.82 | 0.20 | 1.65 | 1.59 | | 33.35 | 5.84 | | | 0.21 | 1.47 |
| 12 | 1.87 | 0.79 | | 2.48 | | 4.82 | | | | 0.30 | 2.08 |
| 13 | 1.17 | 0.18 | | 1.45 | | | | | 1.47 | 1.10 | |

| Glass # | Elemental wt % Bi | Elemental wt % Sr | Elemental wt % Ce | Elemental wt % P | Elemental wt % Li | Elemental wt % F | Elemental wt % O | total elemental alkali content | Total elemental wt % alkaline earth content |
|---|---|---|---|---|---|---|---|---|---|
| 1 | 71.18 | | 0.87 | | 0.16 | 1.98 | 18.30 | 1.71 | |
| 2 | 59.01 | | 0.74 | | 0.14 | 1.67 | 18.56 | 1.45 | 13.52 |
| 3 | 56.42 | | 0.78 | | 0.15 | 1.77 | 19.38 | 1.53 | 14.79 |
| 4 | 54.56 | | 0.76 | | 0.14 | 1.71 | 18.75 | 1.48 | 17.59 |
| 5 | 50.89 | | 0.82 | | 0.22 | 2.59 | 19.55 | 2.24 | 18.33 |
| 6 | 54.56 | | 0.76 | | 0.14 | 3.13 | 18.47 | 1.48 | 16.44 |
| 7 | 56.73 | | 0.79 | | 0.15 | 1.78 | 19.49 | 1.54 | 14.32 |
| 8 | 55.50 | 3.01 | 0.77 | | 0.14 | 1.74 | 19.07 | 1.51 | 16.18 |
| 9 | 51.79 | | 1.25 | | 0.46 | 1.91 | 20.27 | 1.95 | 17.07 |
| 10 | 50.49 | | 0.72 | | 0.13 | 5.03 | 18.26 | 1.40 | 16.69 |
| 11 | 23.69 | | 2.54 | 0.84 | 0.18 | 2.15 | 22.46 | 1.86 | 39.18 |
| 12 | 65.48 | | 0.81 | | 0.25 | 3.04 | 18.06 | 2.63 | 4.82 |
| 13 | 70.00 | | 0.84 | | 0.39 | 8.61 | 14.77 | 1.50 | |

TABLE III

Physical properties of glass compositions and glass frit powders of these compositions.

| Glass # | density (g/cc) | TMA onset temperature (° C.) | TMA softening point (° C.) |
|---|---|---|---|
| 1 | 6.14 | 419 | 430 |
| 2 | 6.01 | 443 | 457 |
| 3 | 4.34 | 446 | 462 |
| 4 | 5.74 | 452 | 463 |
| 5 | 5.48 | 450 | 468 |
| 6 | 5.82 | 457 | 466 |
| 7 | 5.72 | 461 | 473 |
| 8 | 5.71 | 446 | 463 |
| 9 | 5.39 | 450 | 464 |
| 10 | 5.75 | 451 | 490 |

TABLE IV

Electrical Properties of Silver Pastes on 3" × 3" cut cells and 6" full size wafers

| Glass # | frit amount wt % | ZnO additive amount wt % | Ag powder amount wt % | Efficiency on 3" cells | Efficiency on Full 6" wafers |
|---|---|---|---|---|---|
| 1 | 5.00 | 0 | 81.00 | 14.07 | 12.99 |
| 2 | 5.00 | 0 | 81.00 | 13.91 | 14.85 |
| 3 | 5.00 | 0 | 81.00 | 14.35 | 14.72 |
| 4 | 5.00 | 0 | 81.00 | 14.16 | 15.38 |
| 6 | 5.00 | 0 | 81.00 | 14.11 | 14.58 |
| 7 | 5.00 | 0 | 81.00 | 14.02 | 14.95 |
| 8 | 5.00 | 0 | 81.00 | 14.13 | 14.17 |
| 9 | 5.00 | 0 | 81.00 | 14.23 | 15.22 |
| 4 | 1.87 | 5.50 | 78.50 | 13.50 | |
| 1 | 1.87 | 5.50 | 78.50 | 11.50 | |
| 2 | 1.87 | 5.50 | 78.50 | 13.28 | |
| 3 | 1.87 | 5.50 | 78.50 | 11.67 | |
| 6 | 1.87 | 5.50 | 78.50 | 11.00 | |
| 7 | 1.87 | 5.50 | 78.50 | 13.17 | |
| 8 | 1.87 | 5.50 | 78.50 | 12.04 | |
| 9 | 1.87 | 5.50 | 78.50 | 9.80 | |

TABLE V

Table of glass composition for comparative examples represented in wt % of oxide and fluoride salts

| Glass # | SiO2 | Al2O3 | B2O3 | CaO | ZnO | Na2O | Li2O | Bi2O3 | CeO2 | BiF3 |
|---|---|---|---|---|---|---|---|---|---|---|
| A | 4.30 | 0.67 | 10.21 | 0.55 | 13.35 | 0.94 | | 57.85 | | 12.12 |
| B | 1.20 | 0.10 | 12.50 | | | 0.50 | 1.00 | 84.00 | 0.70 | |

TABLE VI

Table of paste solids composition and PV performance for comparative example glasses verses glass described in this document.

| Glass # | frit amount wt % | ZnO additive amount wt % | Ag powder amount wt % | Organic amount wt % | Efficiency on 1″ cells | FF on 1″ cells |
|---|---|---|---|---|---|---|
| A | 3.3 | 4.1 | 80.3 | 12.4 | 13.7 | 70.6 |
| B | 3.3 | 4.1 | 80.3 | 12.4 | 13.4 | 68.7 |
| 9 | 3.3 | 4.1 | 80.3 | 12.4 | 13.2 | 65.8 |
| 3 | 3.3 | 4.1 | 80.3 | 12.4 | 14.3 | 72.7 |
| 4 | 3.3 | 4.1 | 80.3 | 12.4 | 14.2 | 71.8 |
| A | 5.0 | 0.0 | 81.5 | 13.5 | 7.6 | 40.0 |
| B | 5.0 | 0.0 | 81.5 | 13.5 | 8.2 | 43.6 |
| 9 | 5.0 | 0.0 | 81.5 | 13.5 | 13.3 | 68.0 |
| 3 | 5.0 | 0.0 | 81.5 | 13.5 | 13.3 | 68.7 |
| 4 | 5.0 | 0.0 | 81.5 | 13.5 | 13.7 | 70.2 |

What is claimed is:

1. A composition comprising:
   (a) one or more conductive materials;
   (b) one or more glass frits, wherein at least one of the glass frits comprises: $SiO_2$; $B_2O_3$; $Bi_2O_3$; $CeO_2$ 0.1-3 wt %; F 1-10 wt %; and Na+Li+K 1-3 wt %,
   wherein the wt % of F, Na, Li, and K are the calculated elemental weight percent of the raw materials; and
   (c) organic medium,
   wherein the composition is free of a zinc-containing additive.

2. The composition of claim 1, wherein at least one of the glass frits further comprises one or more components selected from the group consisting of: Ca, CaO, Mg, MgO, Sr, SrO, Ba, and BaO.

3. The composition of claim 1, wherein the $CeO_2$ is at 0.75-2.5 wt %.

4. The composition of claim 1, wherein at least one of the glass frits further comprises one or more components selected from the group consisting of: ZnO, $TiO_2$, $Ta_2O_5$, $Nb_2O_5$, and $ZrO_2$.

5. The composition of claim 1, wherein the conductive material comprises Ag.

6. The composition of claim 1, wherein the glass frits are 4-8 wt % of the total composition.

7. The composition of claim 1, s Therein the conductive materials are 75-85 wt % of the total composition.

8. The composition of claim 1, wherein the Na is selected from:
   NaO, $Na_2F$, and mixtures thereof; wherein the Li is selected from: $Li_2O$, LiF, and mixtures thereof; and wherein the K is selected from: $K_2O$, KF, and mixtures thereof.

9. A method of manufacturing a semiconductor device comprising the steps of:
   (a) providing a semiconductor substrate, one or more insulating films, and the composition of claim 1;
   (b) applying the insulating film to the semiconductor substrate,
   (c) applying the thick film composition of claim 1 to the insulating film on the semiconductor substrate, and
   (d) firing the semiconductor, insulating film and thick film composition.

10. The method of claim 9, wherein the insulating film comprises one or more components selected from: titanium oxide, silicon nitride, SiNx:H, silicon oxide, and silicon oxide/titanium oxide.

11. A semiconductor device made by the method of claim 9.

12. A semiconductor device comprising an electrode, wherein the electrode, prior to firing, comprises the composition of claim 1.

13. A solar cell comprising the semiconductor device of claim 12.

14. A composition comprising:
   (a) one or more conductive materials;
   (b) one or more glass frits, wherein at least one of the glass frits comprises:
   $SiO_2$ 2.5-8 wt %;
   $B_2O_3$ 3-10 wt %;
   $Bi_2O_3$ 25-80 wt %;
   $CeO_2$ 0.1-3 wt %;
   F 1-10 wt %; and
   Na+Li+K 1-3 wt %,
   wherein the wt % of F, Na, Li, and K are the calculated elemental weight percent of the raw materials; and
   (c) organic medium wherein said composition is free of a zinc-containing additive.

* * * * *

UNITED STATES PATENT AND TRADEMARK OFFICE
CERTIFICATE OF CORRECTION

PATENT NO. : 8,252,204 B2  
APPLICATION NO. : 12/641484  
DATED : August 28, 2012  
INVENTOR(S) : Alan Frederick Carroll et al.

Page 1 of 1

It is certified that error appears in the above-identified patent and that said Letters Patent is hereby corrected as shown below:

In the Claims:

Col. 15, Line 55, In Claim 7 (Line 1) please change "s Therein" to read -- wherein --.

Signed and Sealed this  
Twenty-fourth Day of September, 2013

Teresa Stanek Rea  
*Deputy Director of the United States Patent and Trademark Office*